United States Patent
Ohkubo et al.

(10) Patent No.: US 11,043,329 B2
(45) Date of Patent: Jun. 22, 2021

(54) COIL COMPONENT

(71) Applicant: TDK CORPORATION, Tokyo (JP)

(72) Inventors: Hitoshi Ohkubo, Tokyo (JP);
Masazumi Arata, Tokyo (JP);
Takahiro Kawahara, Tokyo (JP);
Hokuto Eda, Tokyo (JP); Hiroki Tsujiai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 136 days.

(21) Appl. No.: 16/027,742

(22) Filed: Jul. 5, 2018

(65) Prior Publication Data

US 2019/0013145 A1    Jan. 10, 2019

(30) Foreign Application Priority Data

Jul. 10, 2017  (JP) .............................. JP2017-134868

(51) Int. Cl.
*H01F 27/28*   (2006.01)
*H01F 27/32*   (2006.01)
*H01F 41/04*   (2006.01)
*H01F 27/29*   (2006.01)
*H01F 17/04*   (2006.01)
(Continued)

(52) U.S. Cl.
CPC ....... *H01F 27/324* (2013.01); *H01F 17/0013* (2013.01); *H01F 17/04* (2013.01); *H01F 27/2804* (2013.01); *H01F 27/292* (2013.01); *H01F 41/04* (2013.01); *H01F 2017/0066* (2013.01); *H01F 2017/0073* (2013.01); *H01F 2017/048* (2013.01); *H05K 1/165* (2013.01); *H05K 1/181* (2013.01); *H05K 2201/1003* (2013.01); *H05K 2201/10636* (2013.01)

(58) Field of Classification Search
CPC ................. H01F 17/0013; H01F 17/04; H01F 2017/0066; H01F 2017/048; H01F 2017/0073; H01F 27/324; H01F 27/292; H01F 27/2804; H01F 27/323; H01F 41/04; H05K 1/181; H05K 1/165; H05K 2201/10636
USPC ......................................... 336/200, 232, 222
See application file for complete search history.

(56) References Cited

U.S. PATENT DOCUMENTS

2002/0067235 A1 * 6/2002 Ueda ................... H01F 17/0006
                                                              336/200
2003/0179067 A1    9/2003 Gamou et al.
(Continued)

FOREIGN PATENT DOCUMENTS

CN        1462457 A      12/2003
JP     2009-117546 A      5/2009
(Continued)

*Primary Examiner* — Mang Tin Bik Lian
(74) *Attorney, Agent, or Firm* — Oliff PLC

(57) ABSTRACT

In a planar coil element, a dead space in a non-overlapping region is reduced by designing a total width of a first resin wall and a first turn located in the non-overlapping region to be narrow, more specifically, by designing the total width to be narrower than a total width of a second turn outside the first turn and a second resin wall located inside the turn and also than a total width of a third turn on the outer side and a third resin wall located inside the turn. As a result, a volume of a magnetic element body in a magnetic core portion of a coil can be increased, and an, inductance value, which is a magnetic characteristic, can also be improved.

5 Claims, 6 Drawing Sheets

(51) Int. Cl.
  *H01F 17/00* (2006.01)
  *H05K 1/16* (2006.01)
  *H05K 1/18* (2006.01)

(56) References Cited

U.S. PATENT DOCUMENTS

| | | | | |
|---|---|---|---|---|
| 2014/0176283 | A1* | 6/2014 | Yang | H01F 41/046 336/200 |
| 2015/0035634 | A1* | 2/2015 | Nakamura | H01F 17/0013 336/170 |
| 2015/0035640 | A1* | 2/2015 | Wang | H01F 27/2804 336/200 |
| 2015/0340149 | A1* | 11/2015 | Lee | H05K 1/181 174/260 |
| 2016/0155556 | A1* | 6/2016 | Ohkubo | H01F 17/0013 336/83 |
| 2016/0379750 | A1* | 12/2016 | Hamada | H01F 27/02 336/220 |
| 2017/0040101 | A1* | 2/2017 | Jeong | H01F 27/2804 |
| 2017/0178789 | A1 | 6/2017 | Kim et al. | |
| 2018/0233279 | A1 | 8/2018 | Hamada et al. | |
| 2018/0277293 | A1* | 9/2018 | Ito | H01F 17/0013 |
| 2019/0221358 | A1 | 7/2019 | Kim et al. | |

FOREIGN PATENT DOCUMENTS

| | | |
|---|---|---|
| JP | 2015-220452 A | 12/2015 |
| JP | 2016-103591 A | 6/2016 |
| JP | 2017-011185 A | 1/2017 |
| KR | 10-2017-0073167 A | 6/2017 |

\* cited by examiner

COIL COMPONENT

CROSS-REFERENCE TO RELATED APPLICATIONS

This application is based upon and claims the benefit of priority from Japanese Patent Application No. 2017-134868, filed on 10 Jul. 2017, the entire contents of which are incorporated herein by reference.

TECHNICAL FIELD

An aspect of the present invention relates to a coil component.

BACKGROUND

As a conventional coil component, for example, Japanese Unexamined Patent Application Publication No. 2015-220452 (Patent Document 1) discloses a coil component having a magnetic substance main body including coil conductor patterns formed on both surfaces of an insulating substrate. In the insulating substrate of the coil component of Patent Document 1, a through-hole is provided in a center portion, and a core portion is formed by filling the through-hole with a magnetic substance.

SUMMARY

In the coil component according to the prior art as described above, a non-overlapping region in which coil conductor patterns formed on both surfaces of the insulating substrate do not overlap in a stacking direction is formed around the through-hole, and in the non-overlapping region, there is a dead space in which the coil conductor pattern is not present on one side of the substrate. Since such a dead space does not contribute to an inductance value of the coil component, it may be one factor which impedes the improvement of magnetic characteristics.

As a result of intensive research, the inventors have newly found a technique capable of reducing the dead space and improving the magnetic characteristics.

According to the present invention, there is provided a coil component with improved magnetic characteristics.

A coil component according to an aspect of the present invention includes an insulating substrate having a through-hole; a coil having a first coil conductor pattern formed around the through-hole on one surface of the insulating substrate, a second coil conductor pattern formed around the through-hole on the other surface of the insulating substrate and wound in a winding direction opposite to that of the first coil conductor pattern when seen in a thickness direction of the insulating substrate, and a through-hole conductor provided to pass through the insulating substrate and configured to connect ends of the first coil conductor pattern and the second coil conductor pattern on the through-hole side; resin walls disposed between turns of each of the first coil conductor pattern and the second coil conductor pattern and disposed on an inner side of an innermost turn and on an outer side of an outermost turn of each of the first coil conductor pattern and the second coil conductor pattern; and a magnetic element body provided on one surface and the other surface of the insulating substrate to cover the first coil conductor pattern, the second coil conductor pattern and the resin wall and configured to fill inner sides of the through-hole of the insulating substrate, the first coil conductor pattern and the second coil conductor pattern, wherein there is a non-overlapping region in which the innermost turn of the first coil conductor pattern and the innermost turn of the second coil conductor pattern do not overlap in the thickness direction of the insulating substrate, and a total width of a width of the innermost turn of the first coil conductor pattern and a width of the resin wall located inside the innermost turn in the non-overlapping region is narrower than a total width of a width of a turn outside the innermost turn of the first coil conductor pattern and a width of the resin wall located inside the turn, and also a width of the through-hole conductor is equal to or less than the width of the innermost turn of the first coil conductor pattern.

In the coil component, since a dead space in the non-overlapping region is reduced, it is possible to improve the magnetic characteristics.

According to the coil component according to another aspect of the present invention, in the first coil conductor pattern, a height of the innermost turn may be equal to a height of a turn outside the innermost turn. In this case, since a cross-sectional area of the innermost turn is not excessively narrowed, an increase in electric resistance at the innermost turn can be minimized.

According to the coil component according to still another aspect of the present invention, in the first coil conductor pattern, a width of the resin wall located inside the innermost turn may be wider than a width of the resin wall located between the turns. In this case, the resin wall located inside the innermost turn greatly contributes to the improvement of rigidity of the coil.

According to the coil component according to yet another aspect of the present disclosure, the through-hole of the insulating substrate may expand to the non-overlapping region. In this case, due to the expansion of the through-hole, a magnetic element body can be increased, and the magnetic characteristics are further improved.

DETAILED DESCRIPTION

Figure 1:
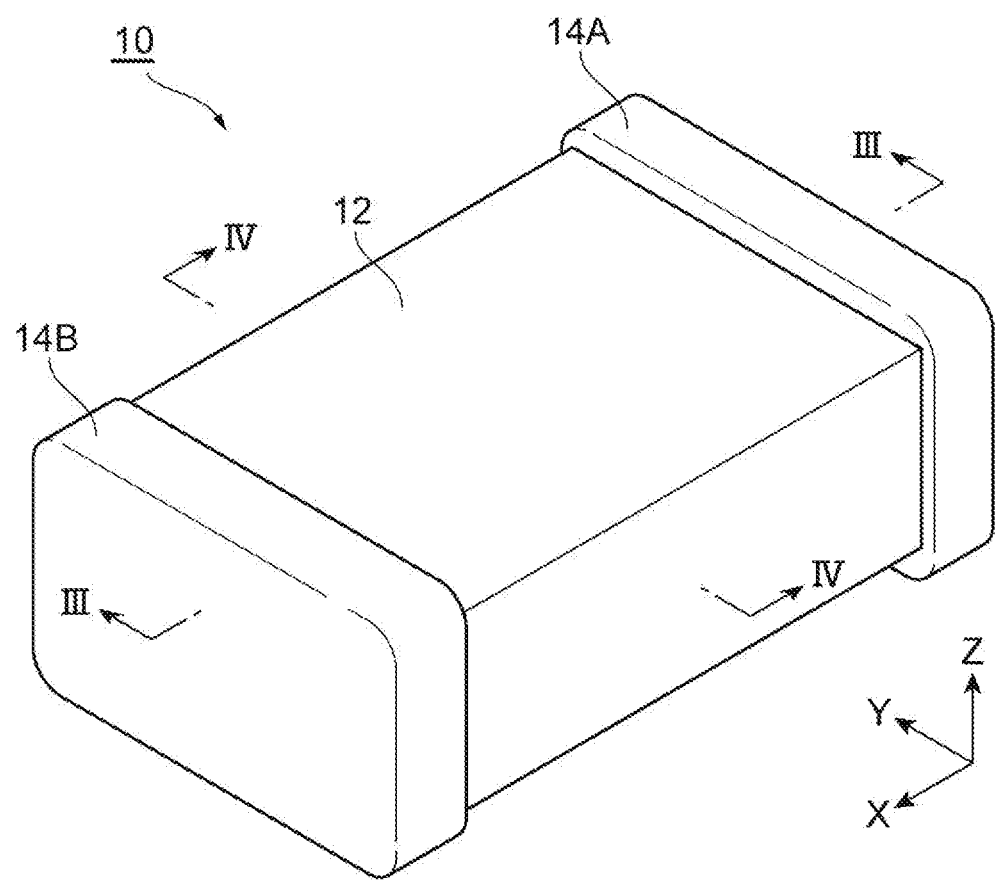
FIG. 1 is a schematic perspective view of a planar coil element according to an embodiment.

Hereinafter, embodiments of the present invention will be described in detail with reference to the accompanying drawings. In the description, the same elements or elements having the same function are designated by the same reference numerals, and repeated description will be omitted.

First, a structure of a planar coil element which is one type of coil component according to the embodiment of the present invention will be described with reference to FIGS. 1 to 5. For convenience of explanation, XYZ coordinates are set as illustrated. That is, a thickness direction of the planar coil element is defined as a Z direction, a direction in which an external terminal electrode faces is defined as an X direction, and a direction orthogonal to the Z direction and the X direction is defined as a Y direction.

A planar coil element 10 includes a main body portion 12 having a rectangular parallelepiped shape and a pair of external terminal electrodes 14A and 14B provided to cover a pair of facing end surfaces 12a and 12b of the main body portion 12. As an example, the planar coil element 10 is designed to have dimensions of a long side of 2.5 mm, a short side of 2.0 mm and a height of 0.8 to 1.0 mm.

The main body portion 12 includes an insulating substrate 20 and a coil C provided on the insulating substrate 20.

The insulating substrate 20 is a plate-shaped member formed of a nonmagnetic insulating material and has a substantially elliptical annular shape when seen in the thickness direction thereof. An elliptical through-hole 20c is provided in a center portion of the insulating substrate 20. As the insulating substrate 20, a substrate having a glass cloth impregnated with an epoxy-based resin and having a thickness of 10 μm to 60 μm can be used. A BT resin, polyimide, aramid or the like can also be used instead of the epoxy-based resin. A ceramic or glass can also be used as a material of the insulating substrate 20. The material of the insulating substrate 20 may be a mass-produced printed circuit board material or may be a resin material used for a BT printed board, an FR4 printed board, or an FR5 printed board.

The coil C includes a first conductor pattern 22A for a planar air-core coil provided on one surface 20a (upper surface in FIG. 2) of the insulating substrate 20, a second conductor pattern 22B for a planar air-core coil provided on the other surface 20b (lower surface in FIG. 2) of the insulating substrate 20, and a through-hole conductor 25 which connects the first conductor pattern 22A with the second conductor pattern 22B.

Figure 2:
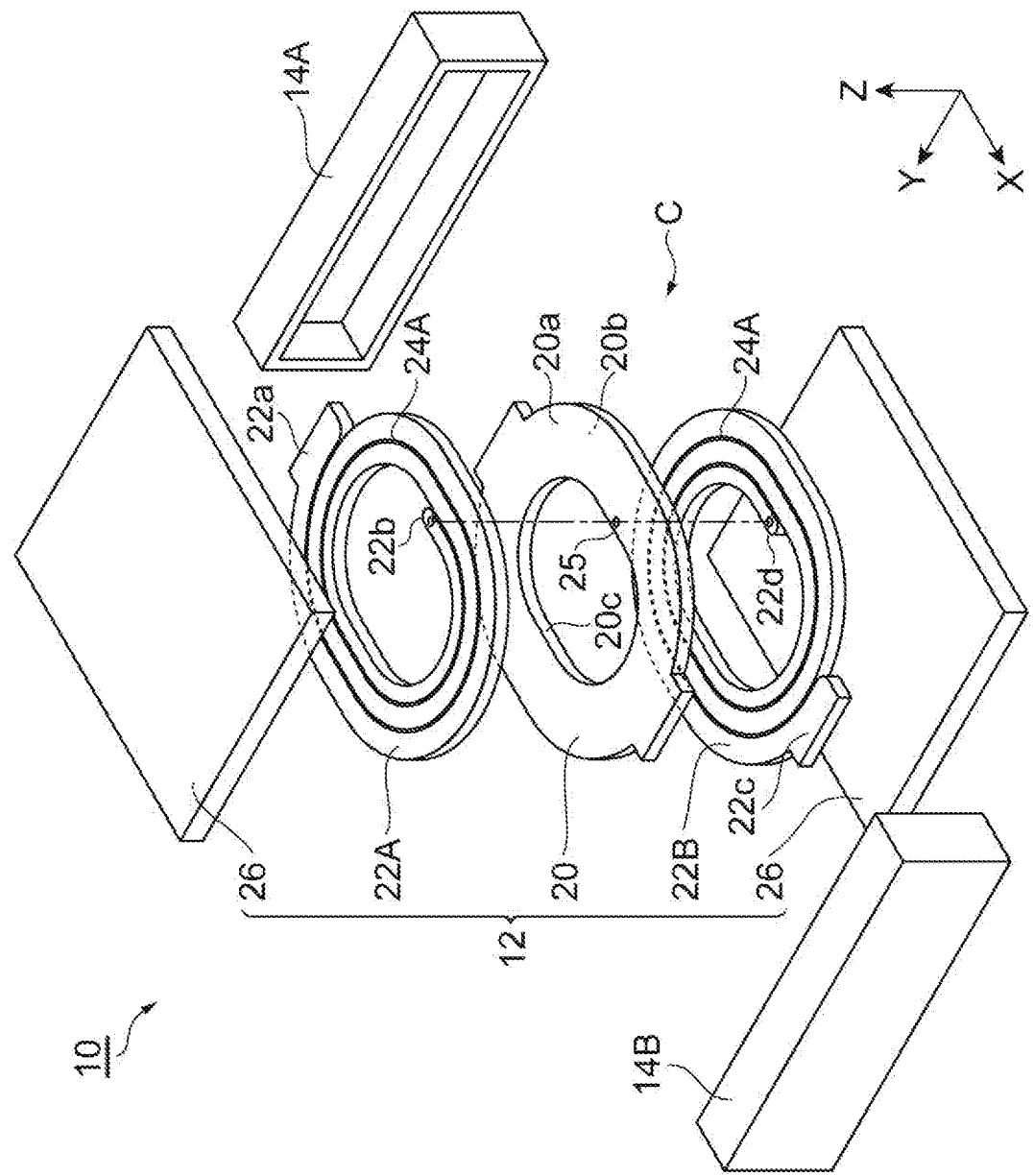
FIG. 2 is an exploded view of the planar coil element illustrated in FIG. 1.
Figure 5:
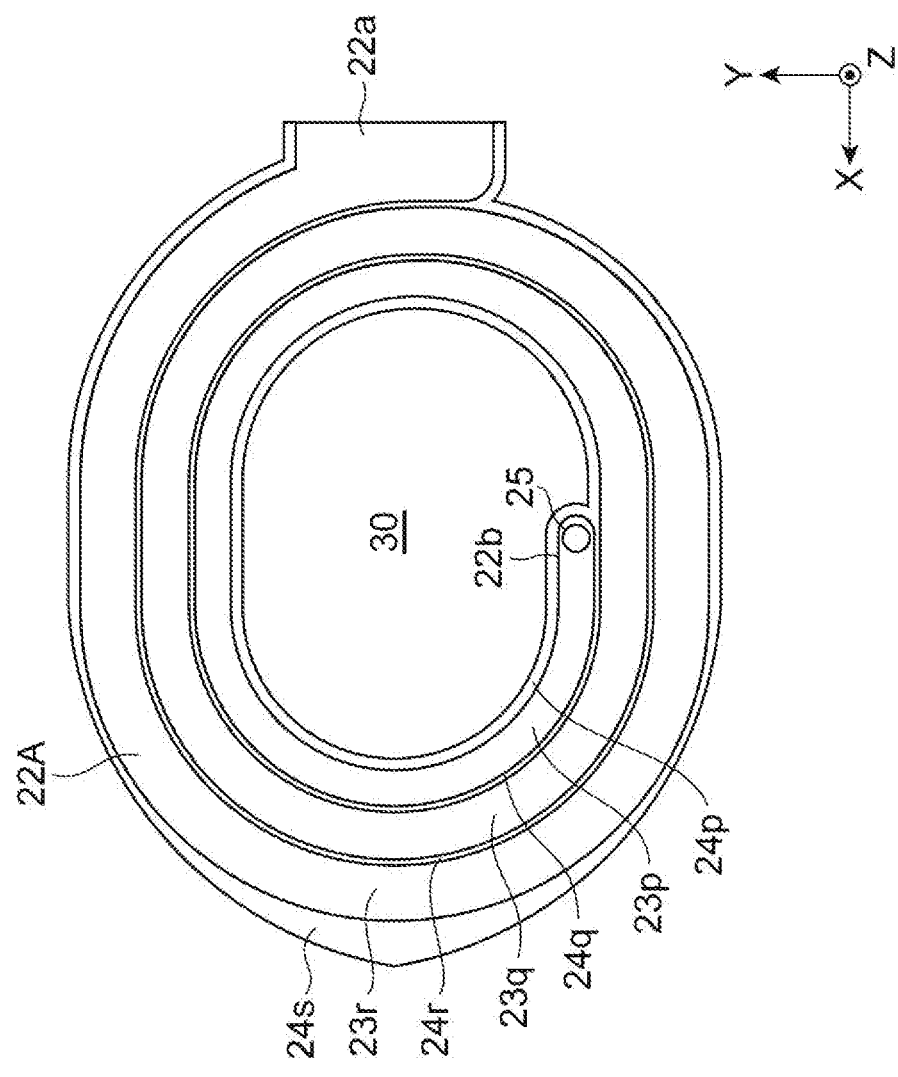
FIG. 5 is a plan view illustrating a first conductor pattern of the planar coil element illustrated in FIG. 1.

The first conductor pattern 22A (first coil conductor pattern) is a planar spiral pattern which becomes a planar air-core coil and is plated with a conductive material such as Cu. The first conductor pattern 22A is formed to be wound around the through-hole 20c of the insulating substrate 20. More specifically, as illustrated in FIGS. 2 and 5, the first conductor pattern 22A is wound outward by three turns in the right direction when seen from above (Z direction). In the following description, the three turns of the first conductor pattern 22A are also referred to as a first turn 23p, a second turn 23q, and a third turn 23r in order from the inside. A height of the first conductor pattern 22A (length of the insulating substrate 20 in the thickness direction) is the same over the entire length, and a height of the first turn 23p, a height of the second turn 23q and a height of the third turn 23r are equal.

An outer end portion 22a of the first conductor pattern 22A is exposed at the end surface 12a of the main body portion 12 and connected to the external terminal electrode 14A covering the end surface 12a. An inner end portion 22b of the first conductor pattern 22A is connected to the through-hole conductor 25.

Like the first conductor pattern 22A, the second conductor pattern 22B (second coil conductor pattern) is also a planar spiral pattern which becomes a planar air-core coil and is plated with a conductive material such as Cu. The second conductor pattern 22B is formed to be wound around the through-hole 20c of the insulating substrate 20. More specifically, the second conductor pattern 22B is wound outward by three turns in the left direction when seen from above (Z direction). That is, the second conductor pattern 22B is wound in a direction opposite to the winding direction of the first conductor pattern 22A when seen from above. A height of the second conductor pattern 22B is the same over the entire length and can be designed to be the same as the height of the first conductor pattern 22A.

An outer end portion 22c of the second conductor pattern 22B is exposed at an end surface 12b of the main body portion 12 and connected to the external terminal electrode 14B covering the end surface 12b. An inner end portion 22d of the second conductor pattern 22B is aligned with the inner end portion 22b of the first conductor pattern 22A in the thickness direction of the insulating substrate 20 and connected to the through-hole conductor 25.

The through-hole conductor 25 is provided to pass through an edge region of the through-hole 20c of the insulating substrate 20 and connects the end portion 22b of the first conductor pattern 22A with the end portion 22d of the second conductor pattern 22B. The through-hole conductor 25 can be constituted by a hole provided in the insulating substrate 20 and a conductive material (a metal material such as Cu or the like) filled in the hole. The through-hole conductor 25 has a substantially columnar or substantially prismatic outer shape extending in the thickness direction of the insulating substrate 20 and has a predetermined width w (that is, a length in a direction orthogonal to the direction in which it extends) as illustrated in FIG. 4.

Figure 3:
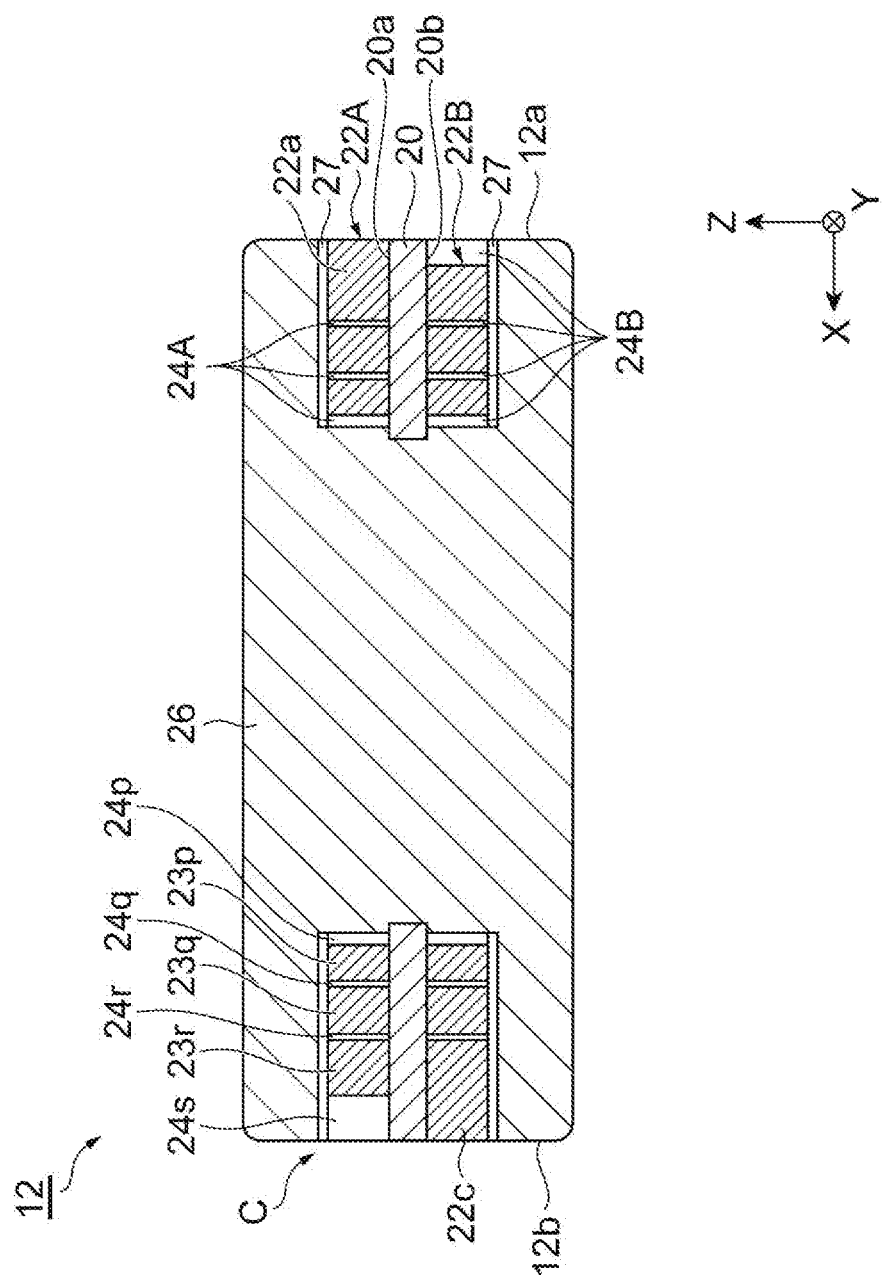
FIG. 3 is a cross-sectional view taken along line of the planar coil element illustrated in FIG. 1.
Figure 4:
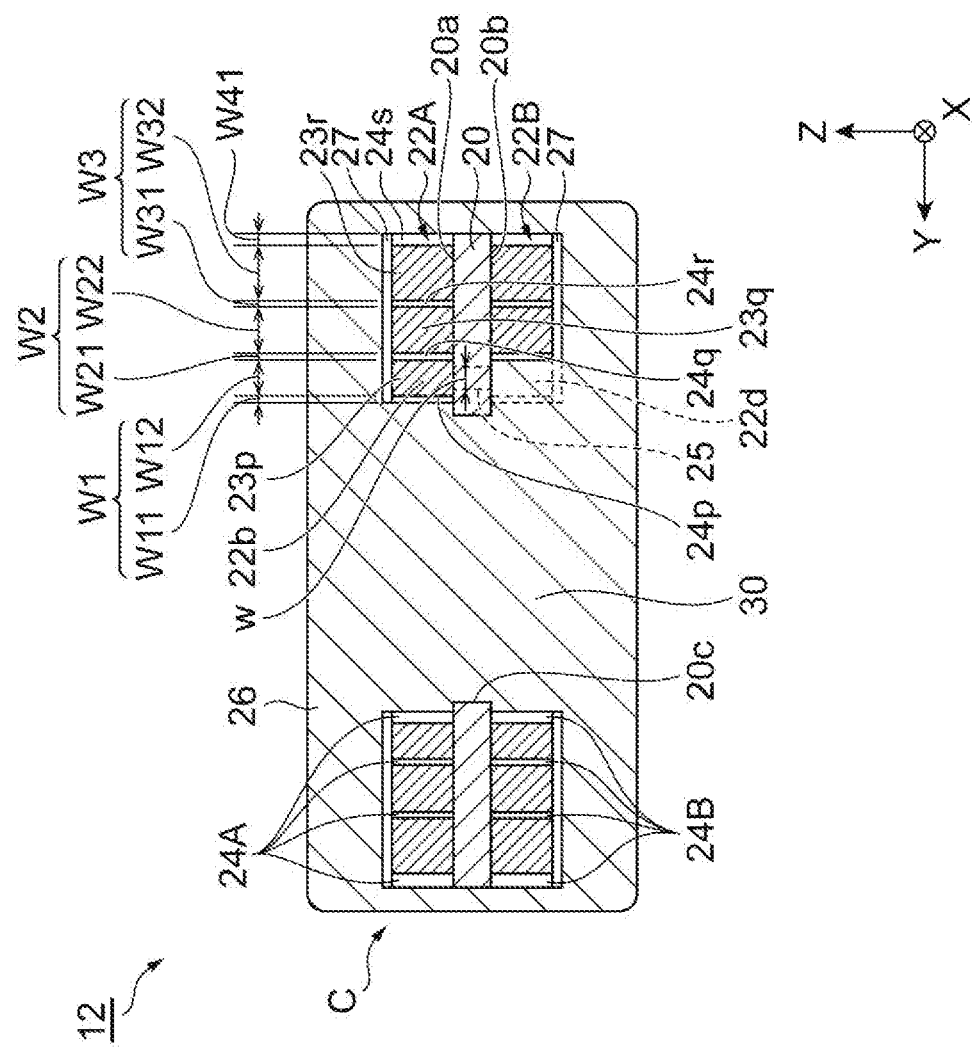
FIG. 4 is a sectional view taken along line IV-IV of the planar coil element illustrated in FIG. 1.

Further, as illustrated in FIGS. 3 to 5, resin walls 24A and 24B are provided on the first conductor pattern 22A and the second conductor pattern 22B, respectively. For example, as illustrated in FIG. 5, the resin wall 24A provided on the first conductor pattern 22A includes a first resin wall 24p located inside the first turn 23p, a second resin wall 24q located between the first turn 23p and the second turn 23q, a third resin wall 24r located between the second turn 23q and the third turn 23r, and a fourth resin wall 24s located outside the third turn 23r.

The resin walls 24A and 24B are formed of an insulating resin material. The resin walls 24A and 24B can be provided on the insulating substrate 20 before the first conductor pattern 22A or the second conductor pattern 22B is formed, and in this case, the first conductor pattern 22A or the second conductor pattern 22B is plated and grown on walls defined by the resin walls 24A and 24B. The resin walls 24A and 24B can be provided on the insulating substrate 20 after the first conductor pattern 22A or the second conductor pattern 22B is formed, and in this case, the resin walls 24A and 24B are provided on the first conductor pattern 22A and the second conductor pattern 22B by filling, coating, or the like.

As illustrated in FIGS. 2 to 4, the main body portion 12 has a magnetic element body 26 covering one surface 20a and the other surface 20b of the insulating substrate. The magnetic element body 26 is formed of a resin containing a metal magnetic powder. For example, a thermosetting epoxy resin may be used as the resin forming the magnetic element body 26. The magnetic element body 26 integrally covers the first conductor pattern 22A, the second conductor pattern 22B, and the resin walls 24A and 24B with an insulating layer 27 interposed therebetween. Further, the magnetic element body 26 is filled inside the through hole 20c of the insulating substrate 20, the first conductor pattern 22A and the second conductor pattern 22B. Furthermore, as illustrated in FIG. 4, the magnetic element body 26 covers the insulating substrate 20, the first conductor pattern 22A and the second conductor pattern 22B from the outside. The insulating layer 27 is provided to be interposed between the first conductor pattern 22A and the magnetic element body 26 and between the second conductor pattern 22B and the magnetic element body 26, thereby enhancing an insulating property between the metal magnetic powder contained in the magnetic element body 26 and the conductor patterns.

The insulating layer 27 may be formed of an insulating resin or an insulating magnetic material.

In the above-described planar coil element 10, since the first conductor pattern 22A and the second conductor pattern 22B approximately overlap in a state in which the insulating substrate 20 is interposed therebetween and both of them are disposed to surround the through-hole 20c of the insulating substrate 20, a magnetic core portion 30 of the coil C is defined by the through-hole 20c of the insulating substrate 20 and the air-core portions of the first conductor pattern 22A and the second conductor pattern 22B. The magnetic core portion 30 is filled with the magnetic element body 26.

In the planar coil element 10, since the first conductor pattern 22A and the second conductor pattern 22B of the coil C are wound in the opposite directions when seen from above, a current can flow through the first conductor pattern 22A and the second conductor pattern 22B connected by the through-hole conductor 25 in one direction. In the coil C, since the direction in which the current flows is the same in the first conductor pattern 22A and the second conductor pattern 22B when the current flows in one direction, magnetic fluxes generated in both of them are superimposed and strengthened.

Here, as illustrated in FIG. 4, there is a non-overlapping region in which the first turn 23p (innermost turn) of the first conductor pattern 22A and the innermost turn of the second conductor pattern 22B do not overlap in the thickness direction of the insulating substrate 20. A total width W1 of a width W11 of the first resin wall 24p and a width W12 of the first turn 23p of the first conductor pattern 22A in the non-overlapping region is narrower than a total width W2 of a width W21 of the second resin wall 24q and a width W22 of the second turn 23q of the first conductor pattern 22A, and a relationship of W1<W2 is formed. Further, the total width W1 of the width W11 of the first resin wall 24p and the width W12 of the first turn 23p of the first conductor pattern 22A in the non-overlapping region is narrower than a total width W3 of a width W31 of the third resin wall 24r and a width W32 of the third turn 23r of the first conductor pattern 22A, and a relationship of W1<W3 is formed.

Also, a width w of the through-hole conductor 25 connected to the end portion 22b of the first turn 23p of the first conductor pattern 22A is equal to or smaller than the width W12 of the first turn 23p.

In the non-overlapping region, there is a dead space in which the coil conductor pattern is not present on the other surface 20b of the insulating substrate 20. Since such a dead space does not substantially contribute to an inductance value of the planar coil element 10, it is one factor which impedes the improvement of magnetic characteristics. Accordingly, the dead space in the non-overlapping region is reduced by designing the total width W1 of the first resin wall 24p and the first turn 23p located in the non-overlapping region to be narrow, more specifically, by designing the total width W1 to be narrower than the total width W2 of the second turn 23q outside the first turn 23p and the second resin wall 24q located inside the turn and also than the total width W3 of the third turn 23r on the outer side and the third resin wall 24r located inside the turn. As a result, a volume of the magnetic element body 26 in the magnetic core portion 30 of the coil C can be increased, and the inductance value, which is a magnetic characteristic, can also be improved. At this time, when the width w of the through-hole conductor 25 is wider than the width W12 of the first turn 23p, the through-hole conductor 25 hinders the narrowing of the width W12 of the first turn 23p, but as in the above-described embodiment, when the width w of the through-hole conductor 25 is equal to or smaller than the width W12 of the first turn 23p, the first turn 23p having the narrow width can be easily designed. Therefore, in the above-described planar coil element 10, the dead space is reduced, and the improvement of the magnetic characteristics is realized.

In the second conductor pattern 22B, like the above-described first conductor pattern 22A, the dead space is reduced by designing the total width of the first resin wall and the first turn located in the non-overlapping region to be narrower than the total width of the turn outside the first turn and the resin wall located inside the turn, and the magnetic characteristics are further improved.

Further, according to the above-described planar coil element 10, in the first conductor pattern 22A, a height of the first turn 23p is equal to a height of the turn (that is, the second turn 23q and the third turn 23r) outside the first turn 23p, and the height of the first turn 23p is not lower than the height of the outer turn. When the height of the first turn 23p is lower than the height of the outer turn, a cross-sectional area of the first turn 23p becomes excessively narrow, and electric resistance at the first turn 23p increases. As in the above-described embodiment, when the height of the first turn 23p is equal to the height of the outer turn, the cross-sectional area of the first turn 23p does not become excessively narrow, and thus an increase in the electric resistance at the first turn 23p can be minimized.

Further, according to the above-described planar coil element 10, in the first conductor pattern 22A, the width W11 of the first resin wall 24p located inside the first turn 23p is wider than the width of the resin wall located between the turns (that is, the width W21 of the second resin wall 24q and the width W31 of the third resin wall 24r). Therefore, the first resin wall 24p greatly contributes to the improvement of rigidity of the coil C.

The present invention is not limited to the above-described embodiment and may take various embodiments.

Figure 6:
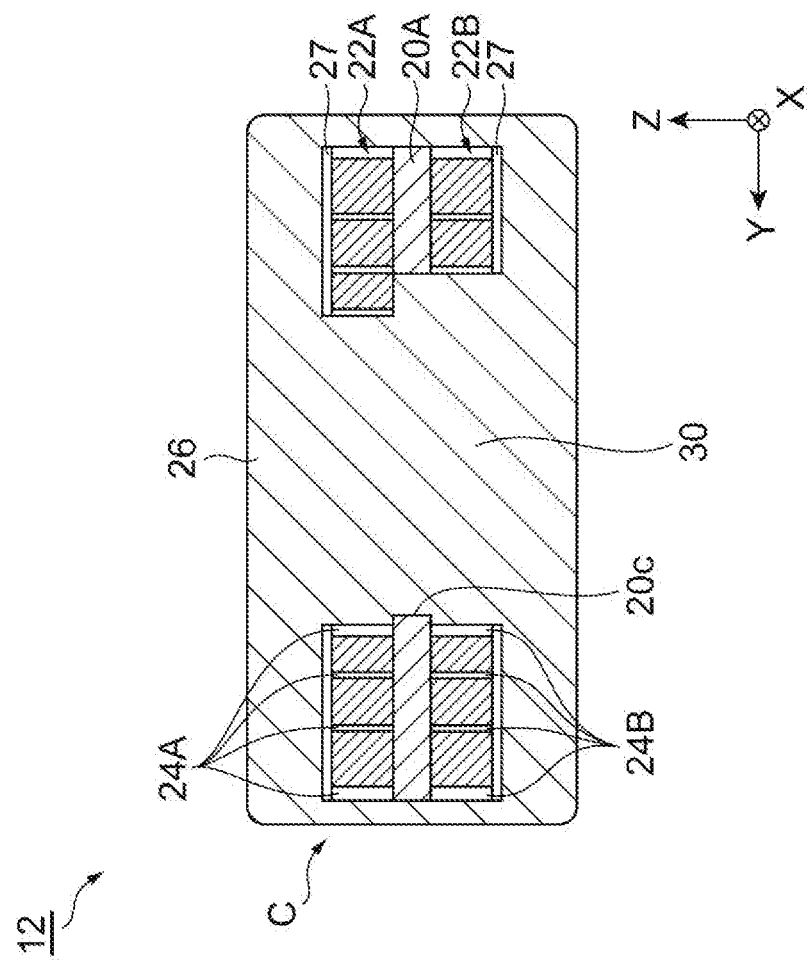
FIG. 6 is a cross-sectional view illustrating a planar coil element of a different aspect.

For example, like the embodiment illustrated in FIG. 6, the through-hole 20c of the insulating substrate 20A may expand to the non-overlapping region. In this case, due to the expansion of the through-hole 20c, the volume of the magnetic element body 26 in the magnetic core portion 30 of the coil C can be further increased, and the inductance value, which is a magnetic characteristic, can be further improved.

What is claimed is:

1. A coil component comprising:
   an insulating substrate having a through-hole;
   a coil having a first coil conductor pattern formed around the through-hole on one surface of the insulating substrate, a second coil conductor pattern formed around the through-hole on the other surface of the insulating substrate and wound in a direction opposite to that of the first coil conductor pattern when seen in a thickness direction of the insulating substrate, and a through-hole conductor provided to pass through the insulating substrate and configured to connect ends of the first coil conductor pattern and the second coil conductor pattern on the through-hole side;
   resin walls disposed between turns of each of the first coil conductor pattern and the second coil conductor pattern and disposed on an inner side of an innermost turn and on an outer side of an outermost turn of each of the first coil conductor pattern and the second coil conductor pattern such that an outermost wall of the resin walls has a shape that corresponds to the outermost turn of the each of the first coil conductor pattern and the second coil conductor pattern when seen in the thickness direction of the insulating substrate; and a magnetic element body provided on one surface and the other surface of the insulating substrate to cover the first coil conductor pattern, the second coil conductor pattern and the resin wall and configured to fill inner sides of the through-hole of the insulating substrate, the first coil conductor pattern and the second coil conductor pattern, wherein:

there is a non-overlapping region in which the innermost turn of the first coil conductor pattern and the innermost turn of the second coil conductor pattern do not overlap in the thickness direction of the insulating substrate;

a total width of a width of the innermost turn of the first coil conductor pattern and a width of the resin wall located inside the innermost turn in the non-overlapping region is narrower than a total width of a width of a turn outside the innermost turn of the first coil conductor pattern and a width of the resin wall located inside the turn;

a width of the through-hole conductor is equal to or less than the width of the innermost turn of the first coil conductor pattern; and in the first coil conductor pattern, (i) the width of the resin wall located inside the innermost turn is wider than a width of the resin wall located between the turns and (ii) the width of the innermost turn is less than a width of the turns between the innermost turn and the outermost turn.

2. The coil component according to claim 1, wherein, in the first coil conductor pattern, a height of the innermost turn is equal to a height of the turn outside the innermost turn.

3. The coil component according to claim 1, wherein the through-hole of the insulating substrate and the non-overlapping region are continuous.

4. The coil component according to claim 1, wherein the insulating substrate has a substantially elliptical annular shape with straight portions on elongated sides and without straight portions on narrower ends when viewed in the thickness direction.

5. The coil component according to claim 1, wherein the magnetic element body is around the periphery of the insulating substrate.

* * * * *